United States Patent [19]
McBride et al.

[11] Patent Number: 5,594,376
[45] Date of Patent: Jan. 14, 1997

[54] CLOCK DESKEWING APPARATUS INCLUDING THREE-INPUT PHASE DETECTOR

[75] Inventors: Ken McBride, Sunnyvale; Cecil Aswell, Orangevale, both of Calif.

[73] Assignee: Micro Linear Corporation, San Jose, Calif.

[21] Appl. No.: 317,674

[22] Filed: Oct. 5, 1994

[51] Int. Cl.$^6$ .............................. H03K 5/13; G01R 25/04
[52] U.S. Cl. ........................ 327/236; 327/146; 327/149; 327/161; 327/231; 327/233; 327/237
[58] Field of Search ............................ 327/141, 144–153, 327/155–163, 231, 233–237, 243–245, 248–252, 291, 292

[56] References Cited

U.S. PATENT DOCUMENTS

| | | | |
|---|---|---|---|
| 4,922,141 | 5/1990 | Lofgren et al. | 327/158 |
| 5,101,117 | 3/1992 | Johnson et al. | 327/148 |
| 5,122,679 | 6/1992 | Ishii et al. | 327/149 |
| 5,274,677 | 12/1993 | Ohuchi et al. | 327/264 |
| 5,295,164 | 3/1994 | Yamamura et al. | 327/159 |
| 5,298,866 | 3/1994 | Kaplinsky | 327/231 |
| 5,361,277 | 11/1994 | Grover | 327/292 |

*Primary Examiner*—Timothy P. Callahan
*Assistant Examiner*—T. Lam
*Attorney, Agent, or Firm*—Haverstock & Associates

[57] ABSTRACT

A clock deskewing apparatus uses either a series terminated single transmission line system or a Thévenin terminated dual transmission line system to deliver a clock signal to a load. A plurality of series terminated clock deskewing apparatuses are implemented, one for each load, so that the clock signal is delivered to all loads coupled to the clock signal simultaneously. Each series clock deskewing apparatus has a single termination resistor with the same impedance value as the transmission line that it is coupled to. Each Thévenin termination system has a voltage divider resistor network. A variable delay line within each series clock deskewing apparatus can be adjusted so that each load receives the clock signal at the same time. A programmable output driver impedance network can be used for the single line termination resistor of the series terminated clock deskewing system in order that the series terminated clock deskewing apparatus can be used with transmission lines having different line impedances. A three input phase detector is coupled to a fixed delay line and to either the series terminated transmission line system or the Thévenin terminated transmission line system for eliminating phase shifts of the clock signals between the different loads.

23 Claims, 7 Drawing Sheets

CLOCK DESKEWING APPARATUS INCLUDING THREE-INPUT PHASE DETECTOR

FIELD OF THE INVENTION

This invention relates to the field of integrated circuit clock generators. More specifically, this invention relates to the field of integrated circuit clock generators which deliver the clock signal to all loads at essentially the same time.

BACKGROUND OF THE INVENTION

For proper operation of a system using integrated circuits on a printed circuit board, it is important that all the loads on the board receive the clock signal at essentially the same time. Because the distance from the clock to the different chips is generally not the same, unless a clock synchronizing technique is used, the loads will receive the clock signal at different times. Many techniques have been used in the prior art to synchronize the clock signal so that it is received by all the loads at the same time. These prior art clock synchronizing techniques include designing the printed circuit board so that all the lines between the clock signal and the loads are the same length and using programmable clock edges. Both of these well known techniques require knowledge about the physical construction of the printed circuit board beforehand.

A clock generator circuit taught by Cecil Kaplinsky in U.S. Pat. No. 5,298,866 is illustrated in FIG. 1. A clock input signal line 1 is coupled to a first end of a maximum delay line 2. A second end of the maximum delay line 2 is coupled to a phase detector 3 for comparing the timing between two signals. This phase detector is similar to a phase-frequency detector as used in phase locked loops. An output of the phase detector 3 is coupled to a low-pass filter 4 for filtering the output of the phase detector. The variable delay lines 5 and 6 are matched so that they have equal delays. Both variable delay lines 5 and 6 are coupled to and controlled by the output of the low-pass filter 4. The maximum delay of the variable delay lines 5 and 6 is equal to half of the delay of the maximum delay line 2. The variable delay lines 5 and 6 will typically be implemented as voltage controlled delay lines.

An output of the variable delay line 5 is coupled as the other input to the phase detector 3. The clock input signal line 1 is coupled as the input of the variable delay line 6. The output of the variable delay line 6 is coupled to an input of an output buffer 7. The output buffer 7 is typically implemented as a TTL or CMOS low impedance driver. An output of the output buffer 7 is coupled by a drive transmission line 11 to a load 9. A sense transmission line 10 is also coupled to the load 9 and to an input of an input buffer 8. An output of the input buffer 8 is coupled as the input to a variable delay line 5. The input buffer 8 can be implemented as a typical TTL or CMOS input gate. The resistors R1 and R2 are termination resistors used to prevent reflections on the transmission lines, and are normally external to the integrated circuit because of their power dissipation. The drive 11 and sense 10 transmission lines are required to have equal propagation delays, achieved by matching the length of these lines.

The clock input signal line 1 is applied to a plurality of identical clock driver sections, each driving a different load 9 with a different external propagation delay along drive and sense transmission lines 11 and 10. Within each clock driver section, the clock input signal line 1 is applied to a fixed maximum delay line 2 and a variable delay line 6. The output of the variable delay line 6 is buffered by the output buffer 7 and applied to the drive transmission line 11 and then to the load 9. The drive transmission line 11 has a propagation time delay $t_d$. This signal then returns to the clock driver section through the sense transmission line 10. The sense transmission line 10 also has a propagation time delay $t_d$, which makes the roundtrip delay from the clock driver section to the load 9 and back again, a time of $2t_d$. The sense transmission line 10 is terminated at the sense point 14 between the two resistors R1 and R2.

The sense point 14 is coupled to the input of the input buffer 8. The output of the input buffer 8 is applied to the variable delay line 5. The other end of the variable delay line 5 is input into the phase detector 3 where it is compared with the output of the maximum delay line 2. The output of the phase detector 3 is then filtered by the low-pass filter 4 and applied to control the variable delay lines 5 and 6 with the control signal line 12. The control signal line 12 is used to vary the delay of the variable delays 5 and 6 such that the inputs to the phase detector 3 arrive simultaneously. The phase detector 3, low pass filter 4 and the voltage controlled variable delay lines 5 and 6 form a Delay Locked Loop.

If the loop gain is sufficient, the delay from the clock input signal 1 through the variable delay line 6, the output buffer 7, the drive transmission line 11, the sense transmission line 10, the input buffer 8 and the variable delay line 5 will be driven by the closed loop, to be equivalent to the delay through the maximum delay line 2. The sufficient gain needed for this delay can be achieved by using an integrator in the low pass filter 4. Any variation in the propagation time delay $t_d$ will automatically be compensated for by the closed loop so that the total delay from the clock input signal 1 to the output 13 of the variable delay line 5 will always be the same, as long as the required delay correction does not exceed the limits of the ranges of the variable delay lines 5 and 6. This relationship can be expressed by the following equation:

$$\text{Delay}(A)=\text{Delay}(E)+\text{Delay}(G)+\text{Delay}(F)+\text{Delay}(D)+2t_d. \quad (1)$$

Since the variable delay lines 5 and 6 are identical, $$\text{Delay}(E)=\text{Delay}(D). \quad (2)$$

The delays through the maximum delay line 2, the output buffer 7 and the input buffer 8 are all constants. Equation (1) can then be rewritten as $$t_d+\text{Delay}(E)=[\text{Delay}(A)-\text{Delay}(F)-\text{Delay}(G)]/2 \quad (3)$$

or $$t_d+\text{Delay}(E)=\text{constant}. \quad (4)$$

If the same clock input signal 1 is applied to a number of identical deskew elements driving loads at different distances, with different transmission line delays, $t_d$, Equation (4) shows that the clock edge will arrive at all loads driven by the different deskew elements at the same time, assuming that the constant is the same for all of the deskew elements in the circuit. As can be seen, the time delay $t_d$ for the load with the longest usable transmission lines will be equal to the constant, with the variable delay time Delay(E) for this load set at zero. For those loads whose time delay $t_d$ is not as long the constant, the difference will be made up by adjusting the variable delay time Delay(E) for that load, so that all loads will receive the clock signal input simultaneously. Thus, the delay time Delay(E) through the variable delay lines 5 and 6 for each load will equal the time delay $t_d$ for the load with the longest usable transmission lines minus the time delay $t_d$ for the specific load or $$\text{Delay}(E) = \text{constant} - t_d \tag{5}$$

The external transmission line section of FIG. 1 is illustrated in FIG. 2. This external transmission line section requires two transmission line segments 10 and 11, one for driving the load 9 and one for sensing the round trip delay from the load 9. The two transmission line segments 10 and 11 can be considered a single tapped transmission line with a tap in the middle to accommodate the load 9.

To prevent reflections from occurring along the transmission line, a resistive termination is required at the sense end 14 of the transmission line. This resistive termination at the output is comprised of the network including the two resistors R1 and R2. The node between the two resistors is the sense node 14 as discussed above. If the transmission line is not properly terminated, reflections from the sense node 14 of the line will be reflected back towards the load 9 and cause undesirable distortion or ringing to appear at the load 9. When the reflections reach the output buffer 7 or driver they are again reflected, further compounding the problem.

The transmission lines 10 and 11 each have a characteristic impedance which is equivalent and designated as $Z_o$. This characteristic impedance will typically have a value of 50 ohms, but can also have other impedance values depending on the transmission lines. The termination network consisting of the resistors R1 and R2 must be resistive in nature and have an equivalent Thévenin value equal to the characteristic impedance $Z_o$ of the transmission line. This type of termination is commonly known as Thévenin termination. It will be apparent to one of ordinary skill in the art that a purely resistive Thévenin termination network can have significant static power dissipation for TTL and CMOS levels.

In reality, no load will have a negligible impedance. A typical load used in common circuitry is a CMOS input buffer which is primarily capacitive and in the range of 5 to 20 picofarads. Capacitors of this size on a tapped delay line will cause reflections of the drive signal which will be reflected back towards the driver or output buffer 7. This reflection will be reflected back by the driver 7 and cause distortion at the load 9 which can be significant with fast rise and fall time signals. Compromise termination and the use of non-linear, TTL type, drivers can help this problem, but will not eliminate it.

This circuit as illustrated in FIG. 1 may cause an error if the load 9 is close enough to the deskew circuit so that there is no external propagation delay. If there is no external delay $t_d$ on the transmission lines 10 and 11 then the Equation (5) becomes $$\text{Delay}(E) = \text{constant}. \tag{6}$$

And if the time delay Delay(E) through the variable delay line 5 differs from the desired value by one half of a clock period, the signal appearing at the load 9 will be inverted from the desired signal. This signal is then delayed again by the time delay Delay(D) through the variable delay line 6 which is also one half clock period in error. The phase detector 3 will see the correct phase when in reality there is a 360 degree error or a 180 degree error at the load.

What is needed is a way to terminate the transmission line without the significant static power dissipation of a parallel termination. What is also needed is a way to eliminate the reflection and re-reflection on the transmission line which causes distortion at the load 9. Further, what is needed is a way to protect against a phase shift at the load which will cause the loads to receive clock edges at different times.

SUMMARY OF THE INVENTION

A clock deskewing apparatus uses either a series terminated transmission line system or a Thévenin terminated transmission line system to deliver a clock signal to a load. A plurality of series clock deskewing apparatuses are implemented, one for each load, so that the clock signal is delivered to all loads coupled to the clock signal simultaneously. Each series clock deskewing apparatus has a single termination resistor with the same impedance value as the transmission line that it is coupled to. The single termination resistor is usually left external to the integrated circuit, to provide flexibility when selecting the impedance of the transmission line. Each Thévenin termination transmission line system has a two resistor termination network. A variable delay line within each series clock deskewing apparatus can be adjusted so that each load receives the clock signal at the same time. A programmable output driver impedance network internal to the integrated circuit can be used instead of the single external termination resistor of the series terminated clock deskewing transmission line system. This can provide flexibility so that different line impedances can be accommodated without requiring a termination resistor external to the integrated circuit. A three input phase detector is coupled to a fixed delay line and to either the series terminated transmission line system or the Thévenin terminated transmission line system for eliminating skew of the clock signals between the different loads.

DETAILED DESCRIPTION OF THE PREFERRED EMBODIMENT

Figure 3:
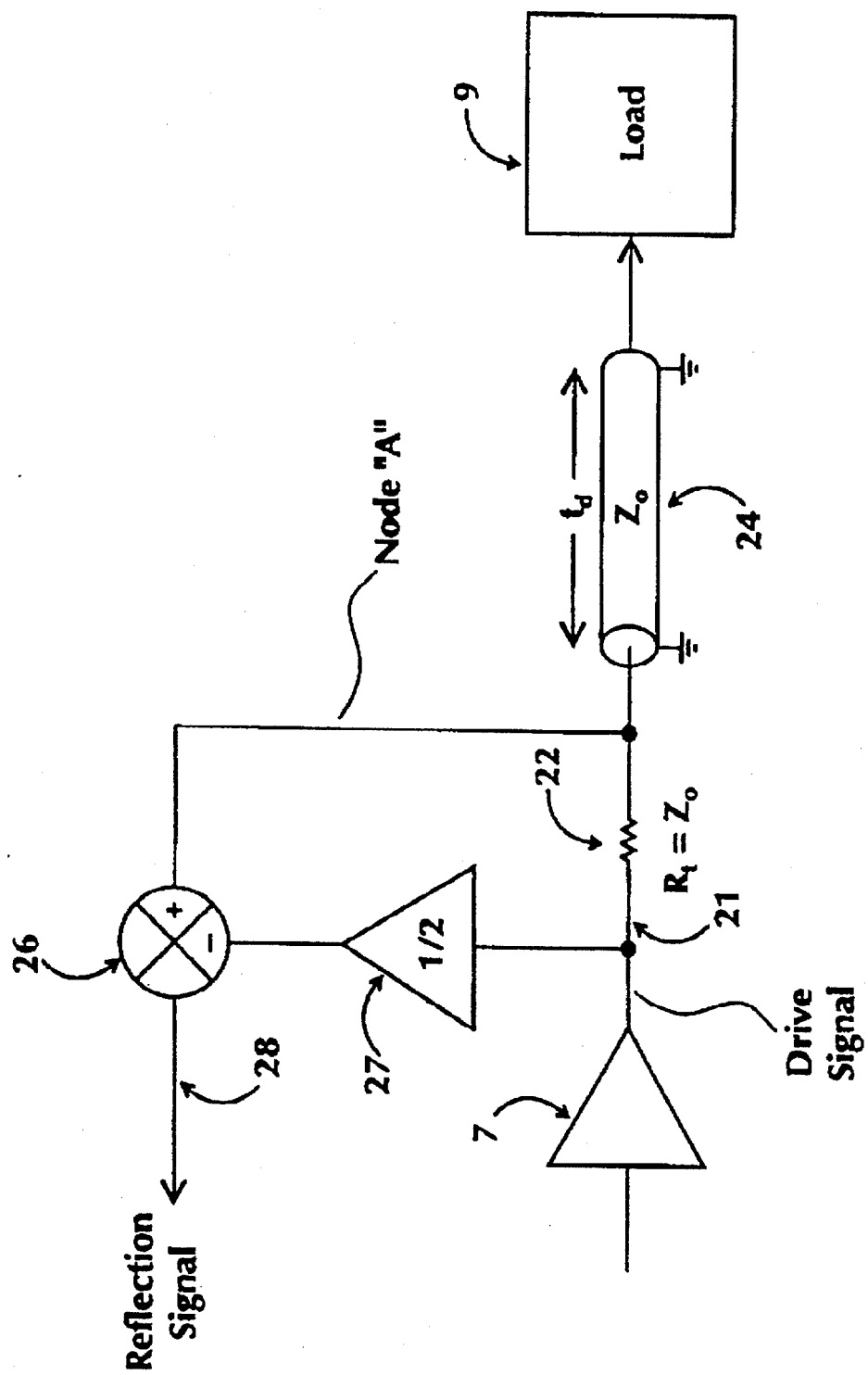
FIG. 3 illustrates a series terminated transmission line system of the present invention.

The present invention avoids the problems associated with Thévenin termination and the use of a tapped transmission line, by using series termination and a single transmission line 24 both for driving the load and for sensing the round trip delay, as is illustrated in FIG. 3. The drive signal 21 from the output buffer or driver 7 is applied to a single termination resistor 22, placed in series with the transmission line 24 and having a resistance which is equal to the impedance of the transmission line 24. The resistor 22 and the transmission line 24 form a voltage divider for signals applied from the driver 7. The junction of the resistor 22 and the transmission line 24 form a node A.

Figure 4:
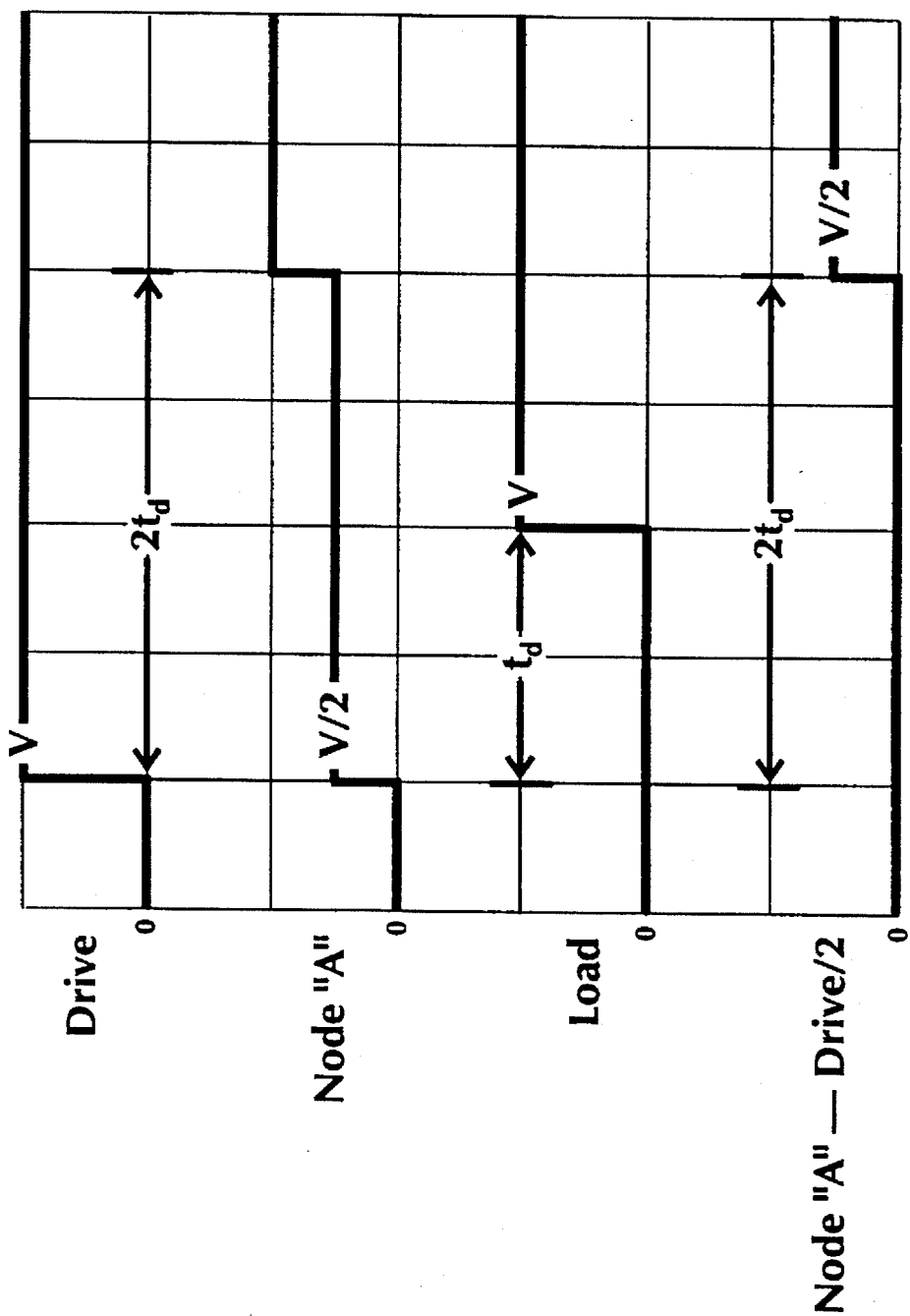
FIG. 4 illustrates the operation of the series terminated system of the present invention.

The operation of the resistor 22 and the transmission line 24 is illustrated in FIG. 4. If a step input of a voltage V is input from the driver 7, a voltage of V/2 will appear at the node A. After a time delay $t_d$, a voltage V/2 step will appear at the load 9. Because the load 9 is a high impedance compared to $Z_o$, the voltage V/2 step will be reflected by approximately one hundred percent (100%), causing the voltage at the load 9 to immediately go to a voltage level V. After another time delay $t_d$, the reflection will appear at the node A, causing its voltage to go to a voltage level V. Because the reflection sees the matched termination resistor 22 there are no further reflections.

The drive signal 21 is also divided in half by the divider 27. The output of the divider 27 is then input into a subtractor 26 which is also coupled to the node A. The subtractor 26 then subtracts the output of the divider 27 from the voltage level at the node A and outputs the result as the reflection signal 28, which is input to the input buffer or the sense amp 8. The divider 27 and the subtractor 26 can be implemented in the circuit by any well known technique.

As described, if one half the drive signal 21 is subtracted from the signal at the node A by the subtractor 26, the result will be a voltage that is one half the level of the drive signal 21 and is delayed by the time delay $2t_d$. This is also illustrated in FIG. 4 for the step input described, but will also hold true for any arbitrary waveform. The output of the subtractor 26 is illustrated in FIG. 4 as the waveform A-Drive/2.

Using the knowledge that the voltage output from the subtractor 26 is one half the voltage of the drive signal 21 delayed by a time delay $2t_d$, the round trip delay can be determined and the deskewing circuitry adjusted as described above. In practice, this information is generated by using a high speed differential comparator, having good common mode rejection, with one input coupled to the node A and the other input coupled to the driver 7 through a voltage divider network having appropriate logic level biases.

Figure 1:
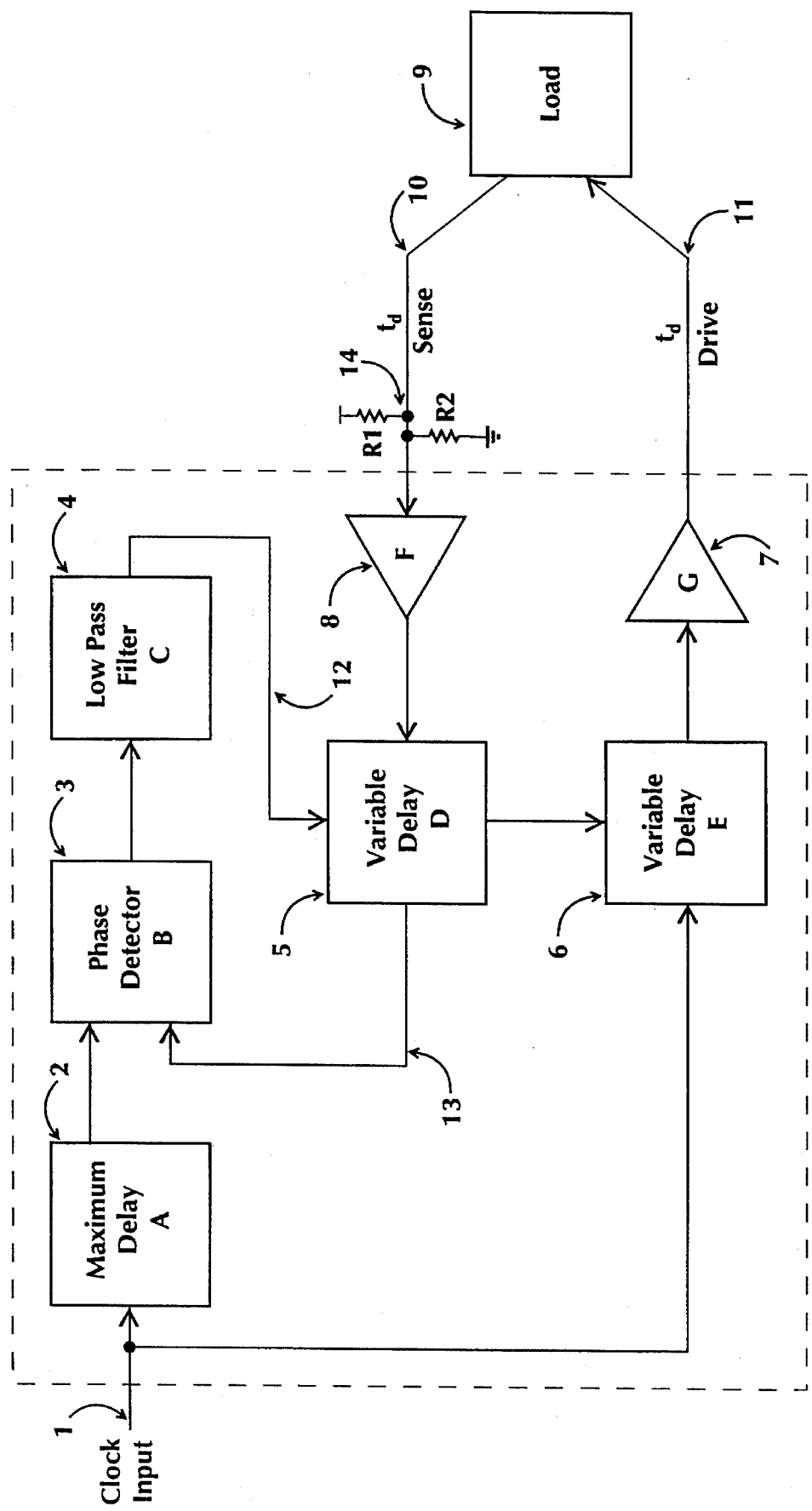
FIG. 1 illustrates a clock driver deskew circuit utilizing a Thévenin terminated transmission line network.
Figure 2:
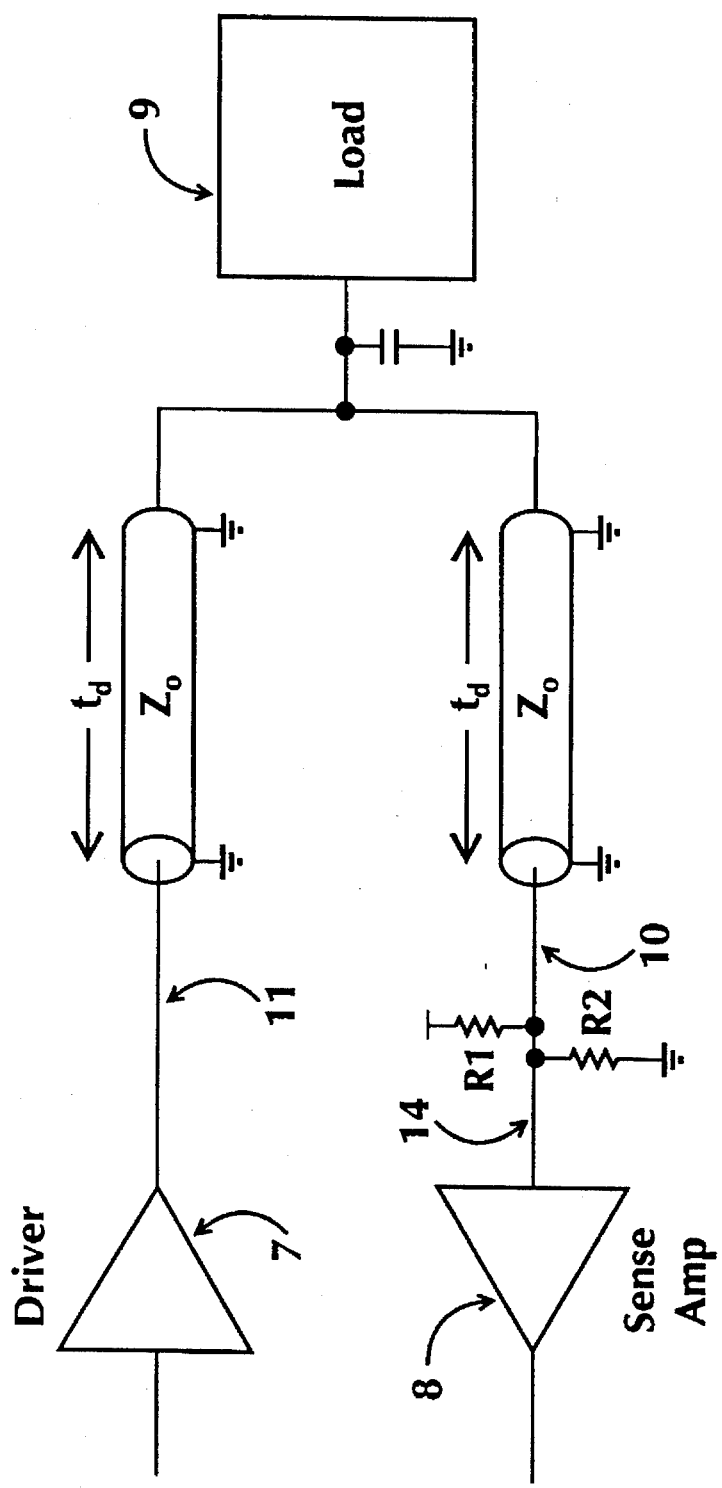
FIG. 2 illustrates the Thévenin terminated transmission line network of FIG. 1.

The single transmission line series terminated system of the present invention can then replace the dual transmission line Thévenin terminated system as illustrated in FIG. 1 and be coupled to the deskew circuit shown within the dotted lines of FIG. 1. The Equation (4) will then also apply to a de-skew circuit using the single line transmission system of the present invention, because the time delay $2t_d$ for the single line system is equal to the time delay $2t_d$ for the dual line system. Thus, if the same clock input signal 1 is applied to a number of identical deskew elements driving the loads 9 at different distances, with different transmission line delays, the clock edge will arrive at all loads driven by the different deskew elements simultaneously, assuming that the constant in Equation (4) is the same for all of the deskew elements in the circuit.

The single transmission line system of the present invention provides many advantages over the dual transmission line system. Only one transmission line is required in the single line system instead of the two transmission lines required by the dual line system. For printed circuit boards with multiple clock lines per board, using only one transmission line can represent a significant savings in board area. Also, in the single transmission line system only one termination resistor is required per clock line as opposed to the two resistor networks which are commonly used to achieve termination in the dual line system. In the single line system no static power is dissipated in the termination network and thus less power will be required for the system. Because of this the series termination resistors are more easily incorporated internally on an integrated circuit. Reflections from capacitive loads will be absorbed by the series termination system and will not be reflected back by the driver 7 as strongly as in the dual line system. There will be some reflection caused by the capacitance of the sense amp 8 input, but this is the same for both the single and parallel line systems.

Figure 5:
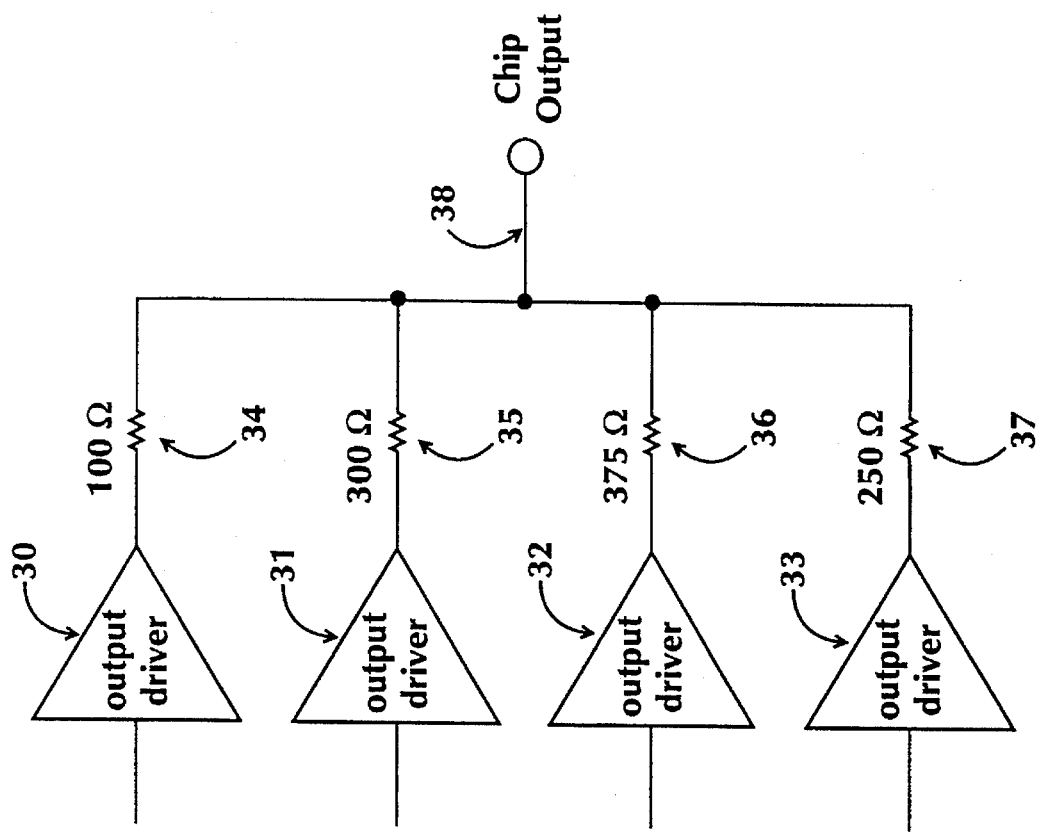
FIG. 5 illustrates an output driver impedance network to be used with the series terminated system of the present invention.

Different printed circuit board trace impedances of 50 Ω, 62.5 Ω, 75 Ω and 100 Ω are commonly used on printed circuit boards. To allow the board-level designer flexibility in choosing a line impedance for a particular application, the circuit as illustrated in FIG. 5 can be incorporated into the series clock deskewing apparatus of the present invention. The clock driver chip can include programmable output driver impedances using the circuit illustrated in FIG. 5 so that the line impedance of the transmission line can be matched. Each output driver 30, 31, 32 and 33 can be individually placed into a high-impedance state, so that any parallel combination of the output resistors 34, 35, 36 and 37 can be used to achieve the impedance of the transmission line. Using just the first driver 30 with the first resistor 34 will obviously achieve a 100 Ω termination impedance. The first two drivers 30 and 31 with the first two resistors 34 and 35 can be used to achieve a 75 Ω termination impedance. The first three drivers 30, 31 and 32 with the first three resistors 34, 35 and 36 can be used to achieve a 62.5 Ω termination impedance. Using all four output drivers 30, 31, 32 and 33 with all four resistors 34, 35, 36 and 37 will achieve a 50 Ω termination impedance. The chip output 38 is then coupled to the transmission line 24 to form the node A.

It will be apparent to one of ordinary skill in the art that this variable impedance scheme could include any four resistor values to provide any four impedance matching values. Additionally, fewer or more parallel output drivers with resistors could be used to achieve fewer or more impedance matching values, where some or all of the output drivers can be individually placed into a high impedance state.

Figure 6:
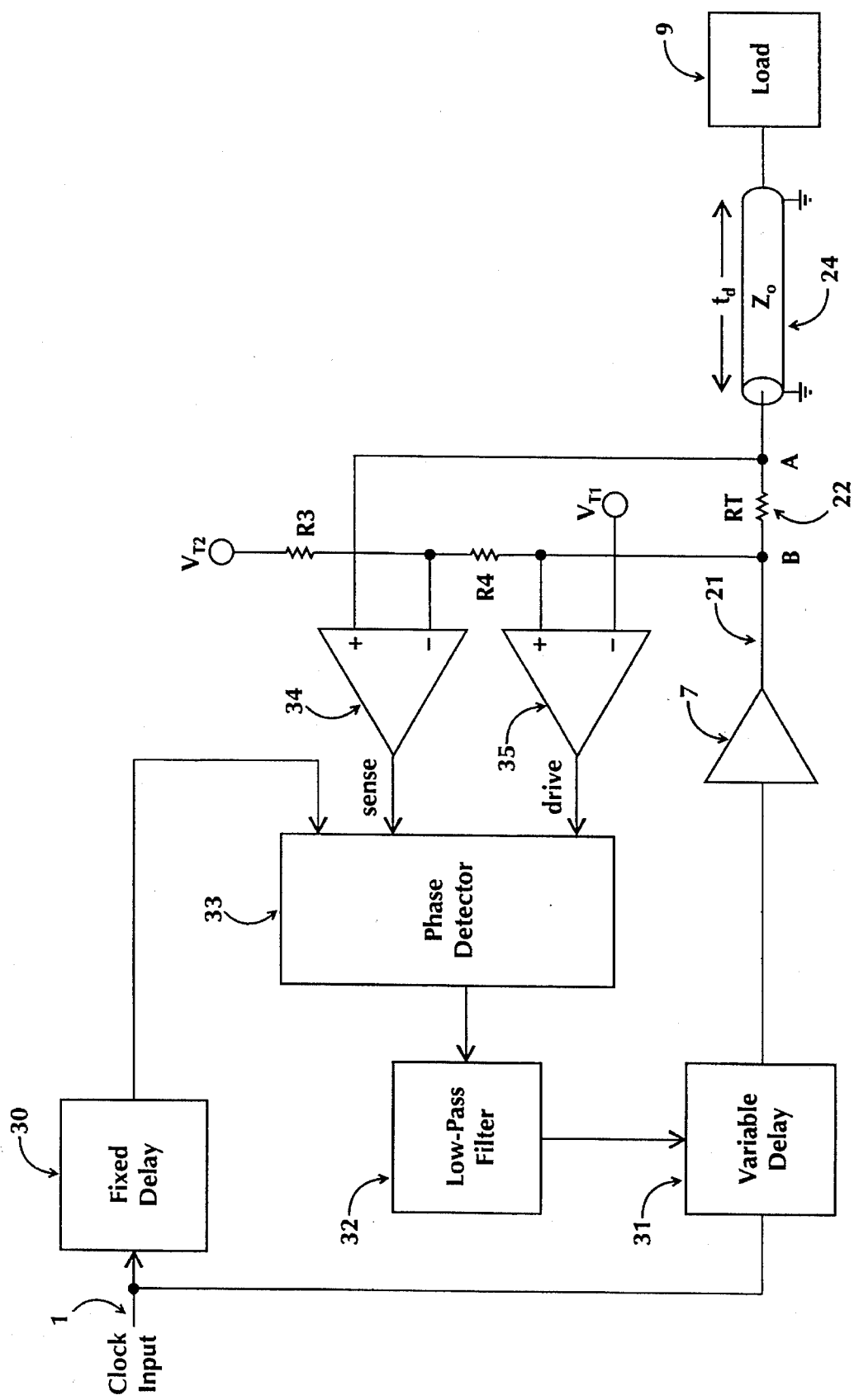
FIG. 6 illustrates a deskew circuit with a three-input phase detector and a series terminated transmission line network.
Figure 7:
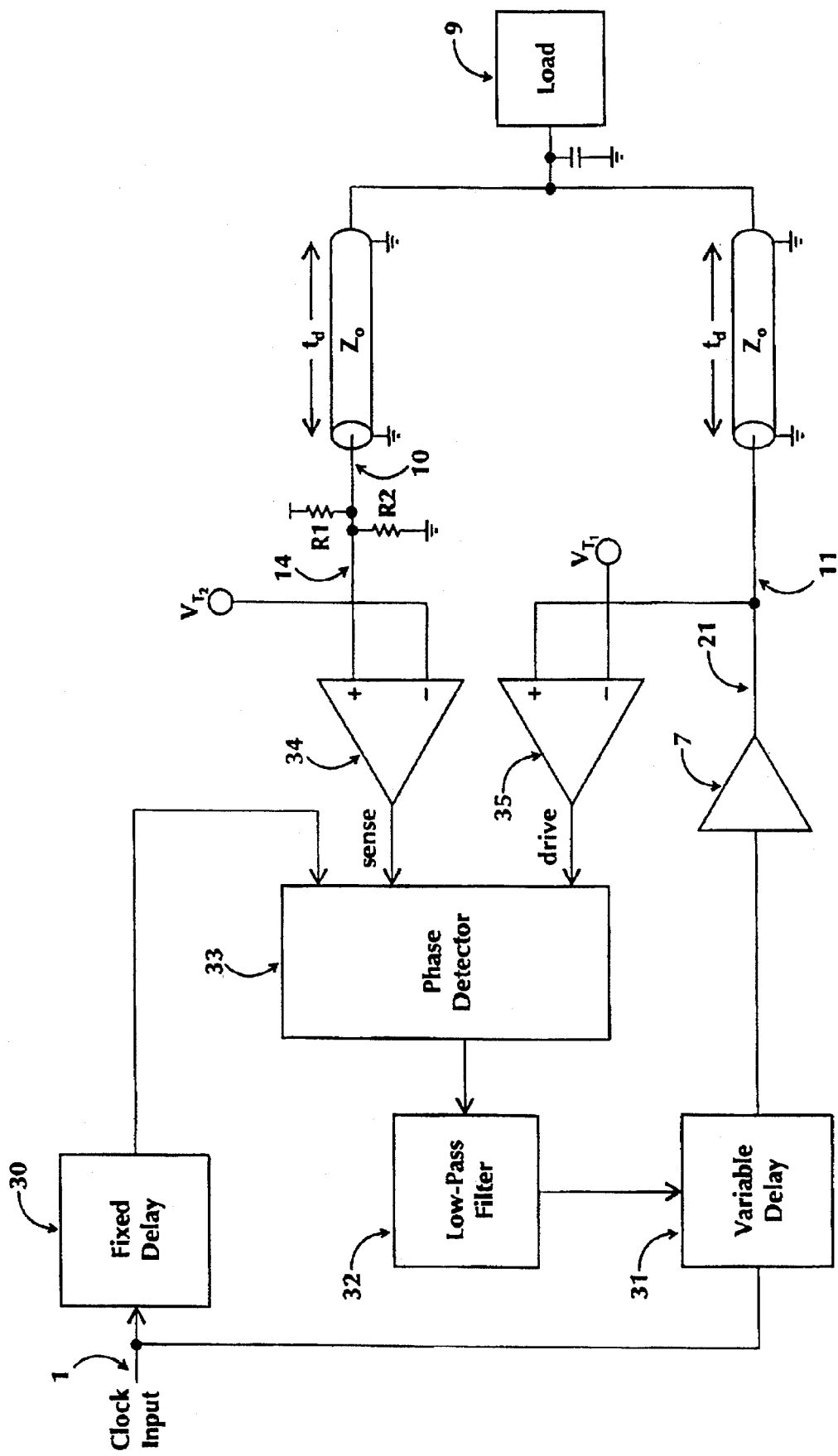
FIG. 7 illustrates a deskew circuit with a three-input phase detector and a Thévenin terminated transmission line network.

The deskew circuit including a three-input phase detector 33 is illustrated in FIG. 6 and FIG. 7. This deskew circuit including the three-input phase detector 33 can be used in combination with the series terminated single line network as illustrated in FIG. 6 or the Thévenin terminated dual line network as illustrated in FIG. 7. The three-input phase detector is used to correct the previously described possible problem of a 180 degree phase shift at the load when using a two-input phase detector. Additionally, the three-input phase detector architecture reduces the amount of overall circuitry in a deskew element over the two-input phase detector architecture, and thus eliminates a source of potential error in the requirement for matched delay lines from Equation (2).

An input of a fixed delay line 30 is coupled to the clock input signal line 1. An output of the fixed delay line 30 is coupled as an input to the phase detector 33. The clock input signal line 1 is also coupled to an input of a variable delay line 31. An output of the variable delay line 31 is coupled to an input of the output driver 7. The output of the output driver 7 is the drive signal line 21 and is coupled to a terminal of the termination resistor 22. The drive signal line 21 is also coupled to a positive input of the comparator 35 and to a terminal of the resistor R4. The other terminal of the resistor R4 is coupled to a terminal of a resistor R3 and to a negative input of a comparator 34. The other terminal of the termination resistor 22 is coupled to the transmission line 24 which has a characteristic impedance $Z_o$. The resistance of the termination resistor 22 should be equal to the characteristic impedance $Z_o$ of the transmission line 24 as discussed above. This can also be done with the programmable output network discussed earlier. The transmission line 24 is also coupled to the load 9. The positive input of the comparator 34 is coupled to the junction of the termination resistor 22 and the transmission line 24. The output of the comparator 34 is coupled as an input to the three-input phase detector 33. The resistors R3 and R4 form a voltage divider with the other terminal of the resistor R3 coupled to the threshold voltage $V_{T2}$. The resistors R3 and R4 are preferably equal in value and are one implementation of the divider 27 shown in FIG. 3. The negative input of the comparator 35 is coupled to the threshold voltage $V_{T1}$.

The threshold voltages $V_{T1}$ and $V_{T2}$ are the logic threshold voltages. The threshold voltages $V_{T1}$ and $V_{T2}$ will normally be equal and their value will be set to one half of the voltage swing at the load 9. For a three volt swing $V_{T1}$ and $V_{T2}$ will normally be set to 1.5 volts. For a five volt swing $V_{T1}$ and $V_{T2}$ will normally be set to 2.5 volts. The threshold voltages serve to provide a comparison voltage level. The comparators 34 and 35 output either a logical high or a logical low depending on the inputs. If the positive input of the comparators 34 and 35 is greater than the negative input, the comparators 34 and 35 will output a logical high. If the positive input of the comparators 34 and 35 is less than the negative input of the comparators 34 and 35, the comparators 34 and 35 will output a logical low.

If the resistors R3 and R4 are equal, the negative voltage input to the comparator 34 will swing halfway between the instantaneous voltage at the node B and the logic threshold $V_{T2}$. This provides comparison voltages slightly above and slightly below the expected voltages at the node A, to provide the overdrive voltage that is necessary for the comparators 34 and 35. The resistors R3 and R4 and the voltage $V_{T2}$ are being used to provide a comparator reference voltage that depends on the instantaneous voltage at the node B. The threshold voltage $V_{T1}$ provides a comparison level for the voltage at the node B. It should be obvious to one skilled in the art that the resistors R3 and R4 do not have to be equal and correspondingly that the threshold voltages $V_{T1}$ and $V_{T2}$ also do not have to be equal. Whatever the combination, the negative input voltage of the comparator 34 will depend on the resistors R3 and R4, the threshold voltage $V_{T2}$ and the instantaneous voltage at the node B.

A series termination network as illustrated in FIG. 6 is the preferred embodiment of the present invention to be used with the three-input phase detector 33. Alternatively, the parallel termination network as described earlier can also be used with the three-input phase detector 33 of the present invention as illustrated in FIG. 7. The drive signal line 21 is coupled to the transmission line 11 and to a positive input of the comparator 35. The threshold voltage $V_{T1}$ is coupled to the negative input of the comparator 35. The threshold voltage $V_{T2}$ is coupled to the negative input of the comparator 34. The transmission line 11 is also coupled to the load 9. The transmission line 10 is coupled between the load 9 and the sense point 14. The Thévenin termination network consisting of the resistors R1 and R2 is coupled to the sense point 14. The sense point 14 is coupled to a positive input of the comparator 34. The outputs of the comparators 34 and 35 are coupled as inputs to the three-input phase detector 33. The threshold voltages $V_{T1}$ and $V_{T2}$ are preferably equal and set to one-half of the logic swing voltage.

The three-input phase detector 33 compares the drive signal line 21 and the reflection signal with the output of the fixed delay line 30. The three-input phase detector 33 will have a net output of zero when the delay between the drive signal and the fixed delays signal is equal to the delay between the fixed delay reference signal and the reflection signal. Since the time between the drive signal and the reflection signal is a delay of $2t_d$, the closed loop will force the drive signal to occur one delay $t_d$ before the fixed delay reference for any delay $t_d$, thus causing all loads 9 to see the clock edges at the same time. It will be apparent to one skilled in the art that a 180 degree phase shift cannot occur at the load 9 using this configuration.

An additional improvement of the three-input phase detector architecture of FIGS. 6 and 7 over the two-input phase detector architecture of FIG. 1 is the reduced amount of circuitry in the former. The variable delay line 5 in FIG. 1 has no corresponding circuitry in FIGS. 6 and 7. The two-input phase detector architecture in FIG. 1 requires delay line 6 to compensate for delay $t_d$ in drive transmission line 11, but delay line 5 exists solely to create a delay that matches the delay in delay line 6. The three-input phase detector architecture in FIGS. 6 and 7 is able to remove the equivalent to the delay line 5 and uses only a single delay line 31. The benefit of the reduced circuitry is less power and less area when implemented in an integrated circuit. Additionally, unavoidable mismatches between variable delay lines 5 and 6 when implemented in integrated circuit form cause an error to be introduced into Equations (2) and (4), which previously had assumed delay lines, 5 and 6 were identical. If the same clock input signal 1 is applied to a number of two input phase detector deskew elements driving loads at different distances, with different transmission line delays $t_d$, random phase error will be introduced between the multiple loads by the mismatch between each delay line pair 5 and 6 in each deskew element. There is no corresponding mismatch problem in the three-input phase detector architecture since only a single delay line 31 is required.

It will be apparent to one of ordinary skill in the art that various modifications may be made to the preferred embodiment without departing from the spirit and scope of the invention as defined by the appended claims. Specifically, while the clock deskewing apparatus of the preferred embodiment has been discussed and described in reference to printed circuit board (PCB) applications, the present invention is not intended to be so limited. It should be apparent to those skilled in the art that there are non-PCB applications in which the clock deskewing apparatus of the present invention may be used.

We claim:

1. A clock deskewing apparatus for delivering a clock signal input to a load, comprising:

a. first means for delay coupled to a clock signal input, for delaying the clock signal input a maximum delay time and outputting a first delayed clock signal;

b. second means for delay coupled to the clock signal input, for variably delaying the clock signal input and outputting a second delayed clock signal;

c. a termination network coupled to a load having a drive output signal line and a reflection signal line, the drive output signal line coupled to the second means for delay; and d. means for synchronizing coupled to the first delayed clock signal, the drive output signal, the reflection signal and the second means for delay for controlling the second means for delay so that the first delayed clock signal, the drive output signal and the reflection signal are all in phase.

2. The clock deskewing apparatus as claimed in claim 1 wherein the termination network is comprised of a series termination network comprising:
   a. an output driver coupled to the second delayed clock signal and the drive output signal line;
   b. a series resistor coupled between the drive output signal line and the reflection signal line;
   c. a transmission line having an impedance coupled to the load and the reflection signal line, the value of the series resistor equal to the impedance of the transmission line;
   d. a first comparator having a first positive input, a first negative input and a first output, the first positive input coupled to the drive output signal line, the first negative input coupled to a threshold voltage, and the first output coupled to the phase detector; and
   e. a second comparator having a second positive input, a second negative input and a second output, the second positive input coupled to the reflection signal line, a first resistor coupled between the first positive input and the second negative input, and a second resistor coupled between the second negative input and the threshold voltage, the first and second resistors forming a voltage divider, the second output coupled to the phase detector.

3. The clock deskewing apparatus as claimed in claim 1 wherein the termination network is comprised of a parallel termination network comprising:
   a. an output driver coupled to the second delayed clock signal and the drive output signal line;
   b. a first transmission line coupled between the drive output signal line and a load;
   c. a second transmission line coupled between the load and the reflection signal line;
   d. a first voltage divider network coupled to the reflection signal line;
   e. a first comparator having a first positive input, a first negative input and a first output, the first positive input coupled to the drive output signal line, the first negative input coupled to a first threshold voltage, and the first output coupled to the phase detector; and
   f. a second comparator having a second positive input, a second negative input and a second output, the second positive input coupled to the reflection signal line and the second negative input coupled to a second threshold voltage.

4. The clock deskewing apparatus as claimed in claim 3 wherein the first and the second threshold voltages are equal in value.

5. The clock deskewing apparatus as claimed in claim 2 wherein the means for synchronizing is comprised of a three-input phase detector having a first input, a second input, a third input and an output, the first input coupled to the first delayed clock signal, the second input coupled to the second output, and the third input coupled to the first output.

6. The clock deskewing apparatus as claimed in claim 5 further comprising a low-pass filter having an input and an output, the input of the low-pass filter coupled to the output of the phase detector and the output of the low-pass filter coupled to the second means for delay.

7. The clock deskewing apparatus as claimed in claim 6 wherein the output driver and the series resistor are replaced by a programmable output driver impedance network comprising a plurality of output drivers each coupled to a series resistor for matching a plurality of transmission line impedances.

8. The clock deskewing apparatus as claimed in claim 7 wherein the programmable output drive impedance network comprises a first output driver coupled to a first series resistor, a second output driver coupled to a second series resistor, a third output driver coupled to a third series resistor and a fourth output driver coupled to a fourth series resistor.

9. The clock deskewing apparatus as claimed in claim 8 wherein the first resistor has a value of 100 ohms, the second resistor has a value of 300 ohms, the third resistor has a value of 375 ohms and the fourth resistor has a value of 250 ohms, for matching transmission line impedances of 100 ohms, 75 ohms, 62.5 ohms and 50 ohms.

10. A circuit comprising a plurality of clock deskewing apparatuses and a corresponding plurality of loads, wherein each load is coupled to one of the plurality of clock deskewing apparatuses for delivering a clock signal input to a load and each of the clock deskewing apparatuses delays the clock signal input a different amount of time so that the clock signal input is received by all loads simultaneously, each of the plurality of clock deskewing apparatuses comprising:
   a. a first means for delay coupled to the clock signal input for delaying the clock signal input a maximum delay time and outputting a first delayed clock signal;
   b. a second means for delay coupled to the clock signal input, for variably delaying the clock signal input and outputting a second delayed clock signal;
   c. a termination network coupled to a load having a drive output signal line and a reflection signal line, the drive output signal line coupled to the second means for delay; and
   d. means for synchronizing coupled to the first delayed clock signal, the drive output signal, the reflection signal and the second means for delay for controlling the second means for delay so that the first delayed clock signal, the drive output signal and the reflection signal are all in phase.

11. The circuit as claimed in claim 10 wherein the termination network is comprised of a series termination network comprising:
   a. an output driver coupled to the second delayed clock signal and the drive output signal line;
   b. a series resistor coupled between the drive output signal line and the reflection signal line;
   c. a transmission line having an impedance coupled to the load and the reflection signal line, the value of the series resistor equal to the impedance of the transmission line;
   d. a first comparator having a first positive input, a first negative input and a first output, the first positive input coupled to the drive output signal line, the first negative input coupled to a threshold voltage, and the first output coupled to the phase detector; and
   e. a second comparator having a second positive input, a second negative input and a second output, the second positive input coupled to the reflection signal line, a first resistor coupled between the first positive input and the second negative input, and a second resistor coupled between the second negative input and the threshold voltage, the first and second resistors forming a voltage divider, the second output coupled to the phase detector.

12. The circuit as claimed in claim 10 wherein the termination network is comprised of a parallel termination network comprising:

a. an output driver coupled to the second delayed clock signal and the drive output signal line;

b. a first transmission line coupled between the drive output signal line and a load;

c. a second transmission line coupled between the load and the reflection signal line;

d. a first voltage divider network coupled to the reflection signal line;

e. a first comparator having a first positive input, a first negative input and a first output, the first positive input coupled to the drive output signal line, the first negative input coupled to a first threshold voltage, and the first output coupled to the phase detector; and f. a second comparator having a second positive input, a second negative input and a second output, the second positive input coupled to the reflection signal line and the second negative input coupled to a second threshold voltage.

13. The circuit as claimed in claim 12 wherein the first and the second threshold voltages are equal in value.

14. The circuit as claimed in claim 11 wherein the means for synchronizing is comprised of a three-input phase detector having a first input, a second input, a third input and an output, the first input coupled to the first delayed clock signal, the second input coupled to the second output, and the third input coupled to the first output.

15. The circuit as claimed in claim 14 further comprising a low-pass filter having an input and an output, the input of the low-pass filter coupled to the output of the phase detector and the output of the low-pass filter coupled to the second means for delay.

16. The circuit as claimed in claim 15 wherein the output driver and the series resistor are replaced by a programmable output driver impedance network comprising a plurality of output drivers each coupled to a series resistor for matching a plurality of transmission line impedances.

17. The circuit as claimed in claim 16 wherein the programmable output drive impedance network comprises a first output driver coupled to a first series resistor, a second output driver coupled to a second series resistor, a third output driver coupled to a third series resistor and a fourth output driver coupled to a fourth series resistor.

18. The circuit as claimed in claim 17 wherein the first resistor has a value of 100 ohms, the second resistor has a value of 300 ohms, the third resistor has a value of 375 ohms and the fourth resistor has a value of 250 ohms, for matching transmission line impedances of 100 ohms, 75 ohms, 62.5 ohms and 50 ohms.

19. A clock deskewing apparatus for delivering a clock signal to a load, comprising:

a. a fixed delay line having an input and an output, the input of the fixed delay line coupled to a clock signal input, for delaying the clock signal input a fixed amount of time and outputting a first delayed clock signal;

b. a variable delay line having an input and an output, the input of the variable delay line coupled to the clock signal input for variably delaying the clock signal input and outputting a second delayed clock signal;

c. a termination network coupled to the output of the variable delay line and to a load, for delivering the clock signal to the load, the termination network having a drive output signal line and a reflection signal line; and d. a three-input phase detector coupled to the output of the fixed delay line and to the termination network, the phase detector also coupled to the variable delay line through a low-pass filter for controlling the variable delay line so that the first delayed clock signal, the drive output signal line and the reflection signal are all in phase.

20. The deskewing apparatus as claimed in claim 19 wherein the termination network is a series network comprising a single transmission line and a series resistor.

21. The deskewing apparatus as claimed in claim 19 wherein the termination network is a parallel network comprising two transmission lines and a voltage divider resistor network.

22. The deskewing apparatus as claimed in claim 19 wherein the termination network comprises a programmable output driver impedance network having a plurality of output drivers each coupled to a series resistor for matching a plurality of transmission line impedances.

23. A phase control circuit for delivering a clock signal input to a load, comprising:

a. a first delay circuit coupled to the clock signal input for delaying the clock signal input a first delay period and outputting a reference edge signal;

b. a second delay circuit coupled to the clock signal input and to a load for delaying the clock signal input a second delay period and outputting a driven edge signal to the load;

c. a receiving circuit coupled to the load for receiving a reflected signal from the load; and d. a phase detector circuit coupled to the first delay circuit, the second delay circuit and the receiving circuit for ensuring that a first time period between the driven edge signal and the reference edge signal is equal to a second time period between the reference edge signal and the reflected signal.

\* \* \* \* \*

UNITED STATES PATENT AND TRADEMARK OFFICE
CERTIFICATE OF CORRECTION

PATENT NO. : 5,594,376
DATED : 1/14/97
INVENTOR(S) : McBride et al.

It is certified that error appears in the above-identified patent and that said Letters Patent is hereby corrected as shown below:

In column 8, line 5, "delays" should read --delay--.

Signed and Sealed this

Twenty-fifth Day of March, 1997

Attest:

BRUCE LEHMAN

Attesting Officer    Commissioner of Patents and Trademarks